(12) United States Patent
Pelfrey

(10) Patent No.: US 10,517,441 B2
(45) Date of Patent: Dec. 31, 2019

(54) ENERGY HARVESTING FOR DISPENSING SYSTEM

(71) Applicant: GOJO Industries, Inc., Akron, OH (US)

(72) Inventor: Keith Allen Pelfrey, Wadsworth, OH (US)

(73) Assignee: GOJO Industries, Inc., Akron, OH (US)

( * ) Notice: Subject to any disclaimer, the term of this patent is extended or adjusted under 35 U.S.C. 154(b) by 410 days.

(21) Appl. No.: 14/837,058

(22) Filed: Aug. 27, 2015

(65) Prior Publication Data
US 2016/0058250 A1    Mar. 3, 2016

Related U.S. Application Data

(60) Provisional application No. 62/042,422, filed on Aug. 27, 2014.

(51) Int. Cl.
| | | |
|---|---|---|
| A47K 5/12 | (2006.01) | |
| H01L 25/16 | (2006.01) | |
| H01L 35/30 | (2006.01) | |
| H02J 7/00 | (2006.01) | |

(Continued)

(52) U.S. Cl.
CPC .......... *A47K 5/1217* (2013.01); *A47K 5/1211* (2013.01); *H01L 25/165* (2013.01); *H01L 35/30* (2013.01); *H01L 35/32* (2013.01); *H02J 7/007* (2013.01); *A47K 5/12* (2013.01); *A47K 5/14* (2013.01); *H01L 2924/0002* (2013.01)

(58) Field of Classification Search
CPC ...... A47K 5/1217; A47K 5/1211; A47K 5/12; A47K 5/14; H01L 25/165; H01L 35/30; H01L 35/32; H01L 2924/0002; H02J 7/007

USPC ........ 222/52; 320/101; 62/3.2; 136/201, 205
See application file for complete search history.

(56) References Cited

U.S. PATENT DOCUMENTS 5,515,682 A * 5/1996 Nagakubo ............... F25B 21/04
                                                  165/259
5,836,482 A * 11/1998 Ophardt ............... A47K 5/1202
                                                  222/325

(Continued)

FOREIGN PATENT DOCUMENTS

JP      2003274680 A    9/2003

OTHER PUBLICATIONS

Int. Search Report/Written Opinion cited in PCT Application No. PCT/US2015/047077 dated Oct. 26, 2015, 23 pgs.

*Primary Examiner* — Paul R Durand
*Assistant Examiner* — Andrew P Bainbridge
(74) *Attorney, Agent, or Firm* — Cooper Legal Group, LLC

(57) ABSTRACT

A dispensing system includes an electronic device. The dispensing system includes a thermoelectric generation device coupled to the electronic device. The thermoelectric generation device includes a first portion, a second portion and a third portion disposed between the first portion and the second portion. The thermoelectric generation device includes an output coupled to the third portion that provides electrical power to the electronic device. The electrical power provided to the electronic device is a function of current induced within the third portion. The current induced within the third portion is a function of a temperature differential between the first portion and the second portion.

19 Claims, 3 Drawing Sheets

(51) Int. Cl.
    *H01L 35/32*    (2006.01)
    *A47K 5/14*     (2006.01)

(56) References Cited

U.S. PATENT DOCUMENTS

| | | | | |
|---|---|---|---|---|
| 6,492,585 | B1* | 12/2002 | Zamboni | H01L 35/32 |
| | | | | 136/201 |
| 7,135,011 | B2 | 11/2006 | Powers et al. | |
| 8,662,356 | B2* | 3/2014 | Padain | A47K 5/1217 |
| | | | | 222/183 |
| 9,837,594 | B2* | 12/2017 | Angermann | H01L 35/10 |
| 2004/0111071 | A1 | 6/2004 | Powers et al. | |
| 2006/0245161 | A1* | 11/2006 | Maruyama | G01R 31/2874 |
| | | | | 361/695 |
| 2007/0000068 | A1* | 1/2007 | Gerard France | D06F 58/203 |
| | | | | 8/158 |
| 2008/0136364 | A1* | 6/2008 | Calvarese | H01M 10/443 |
| | | | | 320/101 |
| 2011/0308259 | A1* | 12/2011 | Wray | F16L 55/103 |
| | | | | 62/3.3 |
| 2014/0137569 | A1* | 5/2014 | Parish | F25B 21/02 |
| | | | | 62/3.2 |
| 2014/0138402 | A1* | 5/2014 | Warren | A47K 5/1202 |
| | | | | 222/2 |
| 2014/0209139 | A1* | 7/2014 | Angermann | H01L 35/10 |
| | | | | 136/200 |
| 2014/0232319 | A1* | 8/2014 | Wegelin | H02J 7/34 |
| | | | | 320/101 |
| 2014/0305479 | A1* | 10/2014 | Nemir | H01L 35/32 |
| | | | | 136/203 |
| 2016/0058250 | A1* | 3/2016 | Pelfrey | A47K 5/1217 |
| | | | | 222/52 |

* cited by examiner

ENERGY HARVESTING FOR DISPENSING SYSTEM

CROSS-REFERENCE TO RELATED APPLICATIONS

This application claims priority to U.S. Provisional Patent Application No. 62/042,422, titled "ENERGY HARVESTING FOR DISPENSING SYSTEM", filed on Aug. 27, 2014, the entire disclosure of which is hereby incorporated by reference.

TECHNICAL FIELD

The instant application is generally directed towards a dispensing system. For example, the instant application is directed towards energy harvesting for a dispensing system.

BACKGROUND

Dispensing systems can dispense a sanitizing and/or other type of material to a user. Dispensing systems can be used, for example, in schools, hospitals, nursing homes, factories, restaurants, etc. Dispensing systems can include one or more electronic devices that can be associated with dispensing the material to the user. For example, the one or more electronic devices can include, but are not limited to, sensors, LEDs, actuators, sound producing devices, etc. Such electronic devices generally consume a relatively small amount of power and thus are often powered by a battery. However, the electronic devices do drain the battery over time (e.g., weeks, months, years, etc.), thus necessitating recharging or replacing of the battery.

SUMMARY

This summary is provided to introduce a selection of concepts in a simplified form that are further described below in the detailed description. This summary is not intended to identify key factors or essential features of the claimed subject matter, nor is it intended to be used to limit the scope of the claimed subject matter.

In an example, a dispensing system comprises an electronic device and a thermoelectric generation device coupled to the electronic device. The thermoelectric generation device comprises a first portion, a second portion, a third portion disposed between the first portion and the second portion and an output coupled to the third portion and configured to provide electrical power to the electronic device. The electrical power provided to the electronic device is a function of current induced within the third portion. The current induced within the third portion is a function of a temperature differential between the first portion and the second portion.

In another example, a dispensing system comprises a container within which a material is contained and from which the material is dispensed. The dispensing system comprises an electronic device operatively coupled to the container. The electronic device can trigger a dispense event of at least some of the material from the container. The dispensing system comprises a thermoelectric generation device coupled to the electronic device. The thermoelectric generation device comprises a first portion, a second portion, a third portion disposed between the first portion and the second portion and an output coupled to the third portion and configured to provide electrical power to the electronic device. The electrical power provided to the electronic device is a function of current induced within the third portion. The current induced within the third portion is a function of a temperature differential between the first portion and the second portion.

In another example, a dispensing system comprises an electronic device and a thermoelectric generation device coupled to the electronic device. The thermoelectric generation device comprises a first portion attached to a surface, a second portion not attached to the surface, a third portion disposed between the first portion and the second portion and an output coupled to the third portion and configured to provide electrical power to the electronic device. The electrical power provided to the electronic device is a function of current induced within the third portion. The current induced within the third portion is a function of a temperature differential between the first portion and the second portion. The temperature differential between the first portion and the second portion is based upon a first temperature of the first portion and a second temperature of the second portion. The first temperature is a function of a first influencing temperature of the surface to which the first portion is attached and the second temperature is a function of a second influencing temperature to which the second portion is exposed.

The following description and annexed drawings set forth certain illustrative aspects and implementations. These are indicative of but a few of the various ways in which one or more aspects can be employed. Other aspects, advantages, and/or novel features of the disclosure will become apparent from the following detailed description when considered in conjunction with the annexed drawings.

DETAILED DESCRIPTION

Figure 1:
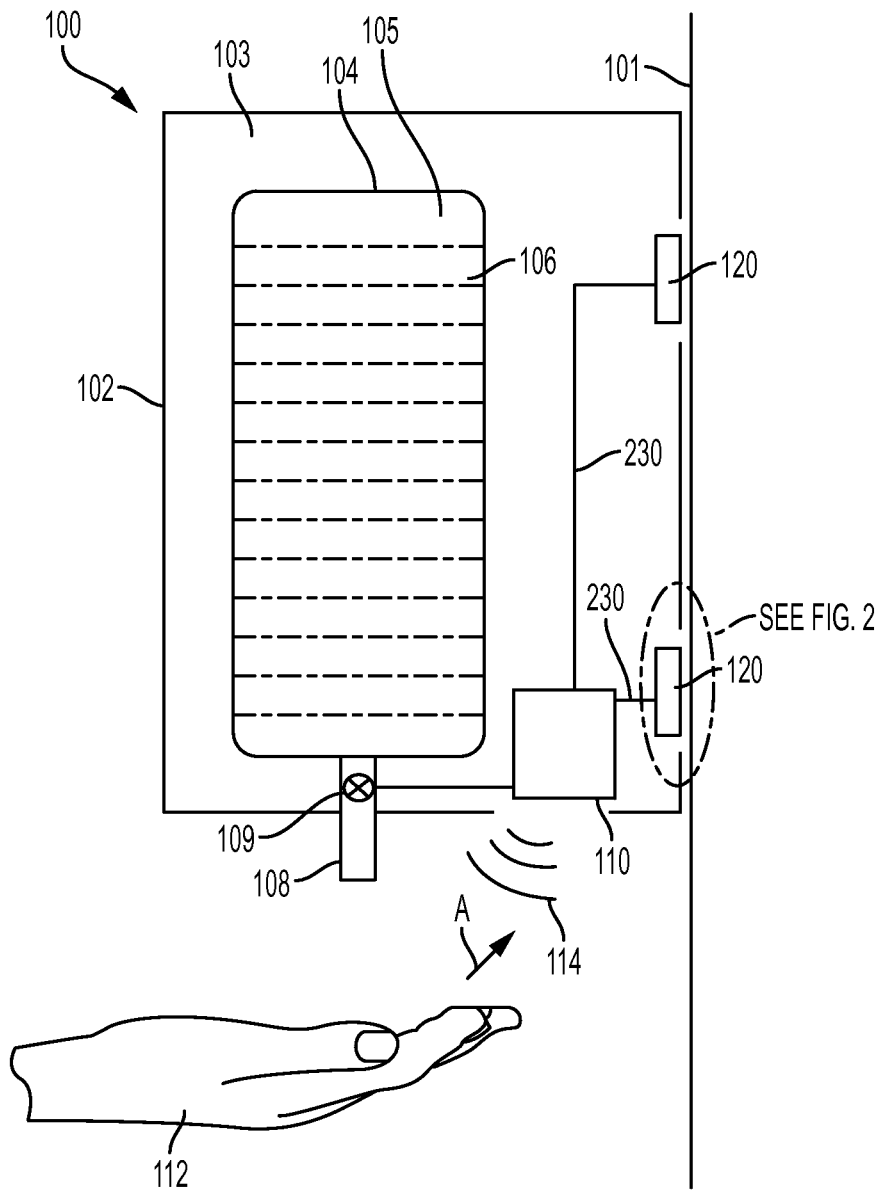
FIG. 1 is an illustration of at least some of an example dispensing system.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter. Relative size, orientation, etc. of parts, components, etc. can differ from that which is illustrated while not falling outside of the scope of the claimed subject matter.

Turning to FIG. 1, a dispensing system 100 is illustrated. In general, the dispensing system 100 can be used for storing and/or dispensing a material. The dispensing system 100 can be attached, for example, to a surface 101. The surface 101 can include a surface of a wall, ceiling, door, mirror, support structure, etc. The dispensing system 100 can be used in a number of different environments, including homes, businesses, hospitals, restaurants, schools, factories, warehouses, prisons, jails, detention centers, mental health facilities, rehabilitation facilities, nursing homes, etc. In a possible example, the surface 101 may be comprised as part of a plumbing structure, such as a plumbing structure that is configured to store, transport, and/or distribute water. For example, the surface 101 may be comprised as part of a pipe, drain, valve, fitting, reservoir, tank, or the like through which a liquid (e.g., water, etc.) may be stored and/or distributed. In these examples, the surface 101, when comprised as part of a plumbing structure, may have a different temperature than the surrounding ambient air.

The dispensing system 100 can include a housing 102. The housing 102 comprises an outer container or enclosure within which portions of the dispensing system 100 can be housed. In some examples, the housing 102 is generally hollow so as to define an interior 103 or cavity within which structures, devices, components, etc. can be received or otherwise disposed. The housing 102 can be formed of a number of different materials that can limit inadvertent or unauthorized access to the interior 103 of the housing 102. In an example, the housing 102 comprises a metal material, such as steel, aluminum, titanium, or the like. In other examples, the housing 102 comprises plastic materials, composite materials (e.g., combinations of materials), etc.

The dispensing system 100 includes a container 104 within which a material 106 is contained and from which the material 106 is dispensed. The container 104 includes one or more sidewalls that define an interior 105 in which the material 106 is stored. The container 104 can be hollow or partially hollow such that the container 104 can store the material 106. In some examples, the container 104 can be rigid (e.g., by being formed from metal material(s), plastic material(s), composite materials, etc.) or non-rigid (e.g., by including bags, pouches, reservoirs, etc.).

The container 104 includes an outlet 108 (e.g., tube, nozzle, etc.) through which the material 106 can be selectively dispensed (e.g., via a check valve, electronic valve, etc.). The outlet 108 can be substantially hollow and can be in fluid communication with the interior 105 of the container 104. In such an example, the outlet 108 can receive the material 106 from the interior 105 of the container 104. The outlet 108 can extend between the interior 103 of the housing 102 and an exterior of the housing 102. As such, the outlet 108 can define a passageway for the material 106 to pass from the interior 105 of the container 104 to the exterior of the housing 102.

The material 106 includes any type of liquid, semi-liquid, gel, powder, foam based material, etc. The material 106 can include, for example, cleaning materials such as disinfectants, sanitizers, antiseptics, soaps, alcohol-infused liquids or the like. In other examples, the material 106 can include water or other non-cleaning liquid materials, such as moisturizers. Indeed, the material 106 is not specifically limited to these examples, and could include other type of materials.

The dispensing system 100 can include one or more electronic devices 110 housed partially or completely within the housing 102. The electronic device 110 is illustrated schematically in FIG. 1, as the electronic device 110 includes a number of different structures, devices, positions, etc. For example, the electronic device 110 can include, but is not limited to, sensors, actuators, light producing devices (e.g., LEDs, etc.), sound producing devices (e.g., speakers, etc.), or the like. Additionally, the electronic device 110 can be positioned at nearly any location within and/or on the housing 102, such as near a front of the housing, near the outlet 108, etc.

The electronic device 110 can be operatively coupled to the container 104 within which the material 106 is contained and from which the material 106 is dispensed. By being operatively coupled to the container 104, the electronic device 110 can be coupled to and/or at least partially comprise an actuator, valve, motor, or other similar device that can selectively allow for the material 106 to be dispensed from the container 104.

Figure 3:
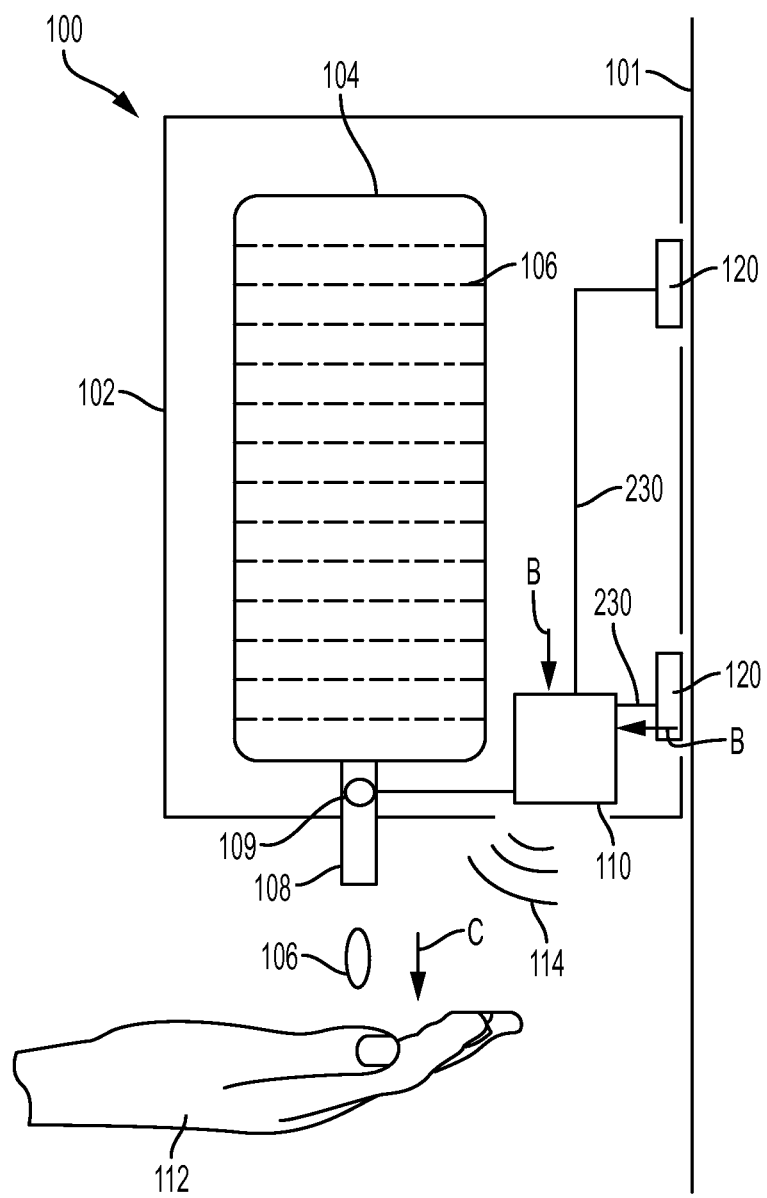
FIG. 3 is an illustration of at least some of an example dispensing system.

In the illustrated example, a valve 109 can be provided within the outlet 108, with the valve 109 being movable between a closed position (illustrated in FIG. 1) and an opened position (illustrated in FIG. 3). The valve 109 can selectively allow for the material 106 to be dispensed. For example, when the valve 109 is in the closed position, the material 106 is generally limited from being dispensed through the outlet 108. When the valve 109 is in the opened position, at least some of the material 106 can flow through the outlet 108 and be dispensed from the outlet 108. In an example, by being operatively coupled to the container 104, the electronic device 110 can be electrically connected to the valve 109 so as to allow for electric current to flow between the electronic device 110 and the valve 109. The electronic device 110 can therefore power the valve 109 so as to move the valve 109 between the closed position and the opened position.

In some examples, the electronic device 110 comprises a sensor (e.g., a proximity sensor, etc.) that can sense 114 a presence of a user 112. The electronic device 110, which can comprise the sensor, can therefore trigger a dispense event of at least some of the material 106 from the container 104. During a dispense event, at least some of the material 106 can be dispensed from the container 104. For example, the user 112 (e.g., user's hand) can move (illustrated with directional arrow A) towards the dispensing system 100. When the user 112 (e.g., user's hand) is within proximity (e.g., a predetermined distance) of the dispensing system 100, the electronic device 110 (e.g., the sensor) can sense 114 the presence of the user 112.

The dispensing system 100 can include one or more thermoelectric generation devices 120. In the illustrated example, two thermoelectric generation devices 120 are illustrated and can have a generally identical size and/or shape. While the dispensing system 100 illustrated in FIG. 1 includes two thermoelectric generation devices 120, in other examples, any number of thermoelectric generation devices 120 are envisioned, where any one or more of the thermoelectric generation devices may (or may not) have a common shape, size, rating, etc.

The thermoelectric generation device 120 is illustrated schematically, as the thermoelectric generation device 120 includes a number of different structures, devices, locations, etc. For example, the thermoelectric generation device 120 can be at least partially disposed within the housing 102, as illustrated. In an example, the thermoelectric generation device 120 can be disposed completely within the housing 102. In another example, the thermoelectric generation device 120 can extend from the interior 103 to an exterior of the housing 102, such that the thermoelectric generation device 120 is disposed partially within the housing 102 and partially not within the housing 102. In another example, the thermoelectric generation device 120 can be disposed and/or supported at an exterior of the housing 102. The thermoelectric generation device 120 can be coupled to the electronic device 110, such as by being electrically connected to the electronic device 110.

Figure 2:
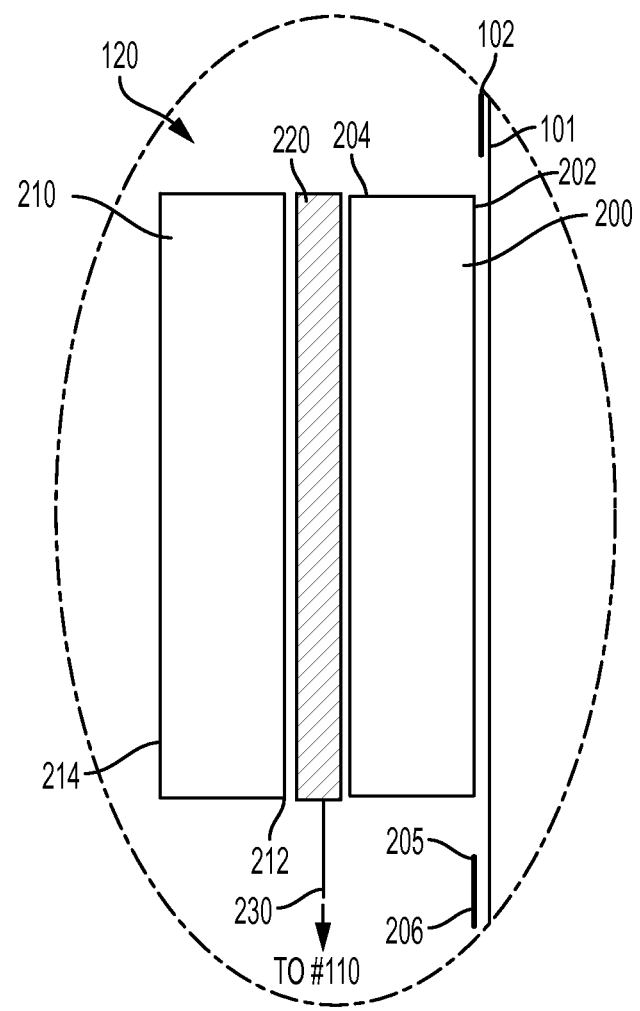
FIG. 2 is an illustration of an example thermoelectric generation device for an example dispensing system.

Turning to FIG. 2, an example of the thermoelectric generation device 120 is illustrated. According to some examples, the thermoelectric generation device 120 comprises one or more Peltier tiles. In an example, thermoelectric generation device 120 comprises a first portion 200, where the first portion may comprise a Peltier tile. The first portion 200 comprises any number of materials, including, for example, ceramic materials.

The first portion 200 extends between a first side 202 and a second side 204. The first side 202 of the first portion 200 can be attached to the surface 101. The first side 202 of the first portion 200 can be attached in any number of ways to the surface 101, such as with adhesives, mechanical fasteners, locking structures, or the like. According to some examples, the first side 202 can directly contact the surface 101. In an example, an opening 205 can be defined within a wall 206 of the housing 102. The thermoelectric generation device 120 can extend through the opening 205 so as to be attached to the surface 101.

The thermoelectric generation device 120 can include a second portion 210, where the second portion may comprise a Peltier tile, for example. The second portion 210 comprises any number of materials, including, for example, ceramic materials. The second portion 210 is spaced a distance apart from the first portion 200 and is positioned on an opposite side of the first portion 200 from the surface 101. The second portion 210 extends between a third side 212 and a fourth side 214. The third side 212 of the second portion 210 can face the first portion 200 and the surface 101 while the fourth side 214 can face away from the first portion 200 and the surface 101. In an example, the fourth side 214 of the second portion 210 is not attached to the surface 101. Rather, the second portion 210, and in particular the fourth side 214 of the second portion 210, can be exposed to air.

The thermoelectric generation device 120 can include a third portion 220 disposed between the first portion 200 and the second portion 210. In an example, the third portion 220 can be disposed adjacent the second side 204 of the first portion 200 and adjacent the third side 212 of the second portion 210. The third portion 220 can be connected to and in contact with the first portion 200 and the second portion 210.

The third portion 220 comprises one or more of a conductive material, a semi-conductive material, and/or a non-conductive material. In some examples, the third portion 220 comprises one or more p-type semiconductor portions and/or one or more n-type semiconductor portions. In some examples, the p-type semiconductor portions and the n-type semiconductor portions are arranged in an alternating order. For example, a p-type semiconductor portion is positioned between two n-type semiconductor portions while an n-type semiconductor portion is positioned between two p-type semiconductor portions. In such an example, the n-type portions have atoms that produce free electrons which can drift to product electric current. The p-type portions have holes in their valence band, such that electrons from the n-type semiconductor portions can flow through the holes of the p-type semiconductor portion. As such, due to this flow of electrons, the third portion 220 can produce current flow.

The thermoelectric generation device 120 can include an output 230. In an example, the output 230 can include one or more conductive wires. The output 230 can be coupled to the first portion 200, the second portion 210, and/or the third portion 220. According to some examples, the output 230 is coupled to the third portion 220 and can provide electrical power to the electronic device 110. For example, a difference in temperature (e.g., temperature differential) between the first portion 200 and the second portion 210 can cause the electrons to move through the third portion 220. This temperature differential can cause current to flow from the third portion 220 and through the output 230. As such, electrical power, derived from the current flow in the third portion, can be delivered to the electronic device 110.

Turning now to FIGS. 2 and 3, an example operation of the dispensing system 100 will be described. In an example, electrical power provided (illustrated schematically with arrowhead B) from the thermoelectric generation device(s) 120 can be a function of current induced within the third portion 220 of the thermoelectric generation device 120. In such an example, the current induced within the third portion 220 is a function of the temperature differential between the first portion 200 and the second portion 210 of the thermoelectric generation device 120. This temperature differential between the first portion 200 and the second portion 210 can be based upon a first temperature of the first portion 200 and a second temperature of the second portion 210.

The first temperature of the first portion 200 can be a function of a first influencing temperature to which the first portion 200 is exposed. For example, the first side 202 of the first portion 200 is attached to the surface 101. The surface 101 can be at the first influencing temperature. The second temperature of the second portion 210 can be a function of a second influencing temperature to which the second portion 210 is exposed. For example, the fourth side 214 of the second portion 210 is not attached to the surface. Rather, the fourth side 214 of the second portion 210 is exposed to air, for example, that provides at least some of the second influencing temperature.

In other examples, to further increase the temperature differential, various methods can be incorporated to affect the first temperature of the first portion 200 and/or the second temperature of the second portion 210. For example, the first portion 200 and/or the second portion 210 can be exposed to fluid or air flow, such as from a fan. Due to this fluid or air flow, the first portion 200 and/or the second portion 210 can experience a reduced first temperature and/or second temperature, respectively. In another example, the first portion 200 and/or the second portion 210 can be exposed to light (e.g., sunlight, etc.), which could increase the first temperature of the first portion 200 and/or the second temperature of the second portion 210.

In an example, the first influencing temperature can be higher than the second influencing temperature. For example, the surface 101 can be exposed to light (e.g., sunlight, etc.) such that the surface 101 can be at a relatively higher temperature (e.g., first influencing temperature) than the air, for example, surrounding the second portion 210 (e.g., second influencing temperature). In another example, the first influencing temperature can be lower than the second influencing temperature. For example, the surface 101 can comprise a thermally conductive material (e.g., metal), such that the surface 101 can be at a lower temperature (e.g., first influencing temperature) relative to the air, for example, surrounding the second portion 210 (e.g., second influencing temperature). For example, the surface 101 can be attached to an exterior wall of a building where the temperature outside of the building is generally different (e.g., lower) than the temperature inside of the building. The second portion 210 can be proximate a hot air hand dryer, for example, to further increase a temperature differential between the first influencing temperature and the second influencing temperature, and thus further increase the temperature differential between the first portion 200 and the second portion 210.

The first influencing temperature of the surface 101 can cause the first portion 200 of the thermoelectric generation device 120 to reach the first temperature. That is, due to heat or energy flowing from a hotter to a colder body by conduction or thermal radiation, a first temperature difference between the first influencing temperature of the surface 101 and the first temperature of the first portion 200 can decrease over time. Similarly, the second influencing temperature (e.g., air temperature in this example) can cause the second portion 210 of the thermoelectric generation device 120 to reach the second temperature. Due to heat or energy flowing from a hotter to a colder body, a second temperature difference between the second influencing temperature of air and the second temperature of the second portion 210 decreases over time. Accordingly, a temperature differential can exist between the first portion 200 and the second portion 210. For example, the temperature differential can be based on a difference between the first temperature of the first portion 200 and the second temperature of the second portion 210.

Current can be induced in the third portion 220 of the thermoelectric generation device 120 as a function of the temperature differential between the first portion 200 and the second portion 210. Referring to FIG. 3, electrical power can be provided (illustrated schematically with arrowhead B) from the thermoelectric generation device(s) 120 to the electronic device 110. According to some examples, this electrical power can be a function of the current induced within the third portion 220. The electrical power can power the electronic device(s) 110 within the dispensing system 100 such that reliance on other power sources (e.g., batteries, A/C electric power supplies, etc.) can be reduced. Indeed, in past examples, electronic devices drew power and caused batteries within dispensing systems to drain over a period of time. In this example, the thermoelectric generation device(s) 120 can provide substantially continuous power to the electronic device 110 (e.g., which itself can comprise a rechargeable battery) over a relatively long period of time with limited and/or reduced need for batteries, etc.

The electronic device 110 can be operatively coupled to the container 104, in particular to the outlet 108 of the container 104, within which the material 106 is contained and from which the material 106 is dispensed. In an example, the electronic device 110 can trigger a dispense event (illustrated schematically with arrowhead C) of at least some of the material 106 from the container 104. That is, due to the electronic device 110 being powered by the thermoelectric generation device 120, the electronic device 110 can have the power needed to trigger the dispense event at any or nearly any desired time.

In this example, the electronic device 110 comprises a sensor that senses 114 the presence of the user 112 in proximity to the dispensing system 100. In response to sensing 114 the user 112, the electronic device 110 can power the valve 109 so as to move the valve 109 from the closed position and the opened position. With the valve 109 in the opened position, a dispense event can occur such that the material 106 is dispensed from the container 104 through the outlet 108 to the user 112. The electronic device 110 can sense when the user 112 is no longer in proximity to the dispensing system 100, such as when the user 112 moves away from the dispensing system 100. At such time, the valve 109 can be moved from the opened position to the closed position, whereupon the material 106 is no longer dispensed through the outlet 108.

The dispensing system 100 is beneficial due, at least in part, to a reduced reliance on batteries and/or other power supplies. For example, the thermoelectric generation device(s) 120 can utilize the temperature differential between ambient air, for example, and surfaces 101 to produce electrical power. This electrical power can be provided to one or more electronic devices 110 within the dispensing system 100. As such, the time between replacing and/or recharging batteries within the dispensing system 100 is increased.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing at least some of the claims.

Various operations of embodiments are provided herein. The order in which some or all of the operations described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

Many modifications can be made to the instant disclosure without departing from the scope or spirit of the claimed subject matter. Unless specified otherwise, "first," "second," or the like are not intended to imply a temporal aspect, a spatial aspect, an ordering, etc. Rather, such terms are merely used as identifiers, names, etc. for features, elements, items, etc. For example, a first component and a second component generally correspond to component A and component B or two different or two identical components or the same component.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been illustrated and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure can have been disclosed with respect to only one of several implementations, such feature can be combined with one or more other features of the other implementations as can be desired and advantageous for any given or particular application.

What is claimed is:

1. A dispensing system comprising:
a housing defining a cavity, the housing attached to a surface, wherein the surface is not within the cavity;
an electronic device disposed within the housing; and
a thermoelectric generation device coupled to the electronic device, the thermoelectric generation device comprising:
a first portion;
a second portion;
a third portion disposed between the first portion and the second portion; and
an output coupled to the third portion and configured to provide electrical power to the electronic device, wherein the electrical power provided to the electronic device is a function of current induced within the third portion, wherein the current induced within the third portion is a function of a temperature differential between the first portion and the second portion, wherein the temperature differential between the first portion and the second portion is based upon a first temperature of the first portion and a second temperature of the second portion, wherein the first temperature is a function of a first influencing temperature of the surface to which the housing is attached and the second temperature is a function of a second influencing temperature within the cavity to which the second portion is exposed,
wherein the housing comprises a wall that defines an opening through which at least some of the thermoelectric generation device extends.

2. The dispensing system of claim 1, wherein the wall is attached to the surface.

3. The dispensing system of claim 1, wherein the first portion is attached to the surface.

4. The dispensing system of claim 3, wherein the second portion is not attached to the surface.

5. The dispensing system of claim 1, wherein the electronic device is operatively coupled to a container within which a material is contained and from which the material is dispensed.

6. The dispensing system of claim 5, wherein the electronic device comprises a sensor configured to trigger a dispense event of at least some of the material from the container.

7. The dispensing system of claim 6, wherein the sensor is configured to sense a presence of a user.

8. The dispensing system of claim 5, wherein the container is contained within the housing.

9. The dispensing system of claim 1, wherein the thermoelectric generation device is at least partially disposed within the housing.

10. The dispensing system of claim 1, wherein the thermoelectric generation device comprises one or more Peltier tiles.

11. A dispensing system comprising:
a housing defining an opening, the housing attached to a surface and the opening facing the surface;
a container, within which a material is contained and from which the material is dispensed, disposed within the housing;
an electronic device disposed within the housing and operatively coupled to the container, the electronic device configured to trigger a dispense event of at least some of the material from the container; and
a thermoelectric generation device coupled to the electronic device, the thermoelectric generation device comprising:
a first portion exposed to a first influencing temperature of the surface through the opening;
a second portion;
a third portion disposed between the first portion and the second portion; and
an output coupled to the third portion and configured to provide electrical power to the electronic device, wherein the electrical power provided to the electronic device is a function of current induced within the third portion, wherein the current induced within the third portion is a function of a temperature differential between the first portion and the second portion.

12. The dispensing system of claim 11, wherein the temperature differential between the first portion and the second portion is based upon a first temperature of the first portion and a second temperature of the second portion.

13. The dispensing system of claim 12, wherein the first temperature is a function of the first influencing temperature to which the first portion is exposed and the second temperature is a function of a second influencing temperature to which the second portion is exposed.

14. The dispensing system of claim 11, wherein the first portion is attached to the surface that provides at least some of the first influencing temperature.

15. The dispensing system of claim 14, wherein the second portion is not attached to the surface.

16. A dispensing system comprising:
a housing defining a cavity, the housing attached to a surface, wherein the surface is not within the cavity;
an electronic device comprising a proximity sensor configured to sense a presence of a user; and
a thermoelectric generation device coupled to the electronic device, the thermoelectric generation device comprising:
a first portion attached to the surface;
a second portion not attached to the surface;
a third portion disposed between the first portion and the second portion; and
an output coupled to the third portion and configured to provide electrical power to the electronic device such that the proximity sensor may sense the presence of the user, wherein the electrical power provided to the electronic device is a function of current induced within the third portion, wherein the current induced within the third portion is a function of a temperature differential between the first portion and the second portion, wherein the temperature differential between the first portion and the second portion is based upon a first temperature of the first portion and a second temperature of the second portion, wherein the first temperature is a function of a first influencing temperature of the surface to which the first portion is attached and the second temperature is a function of a second influencing temperature within the cavity to which the second portion is exposed.

17. The dispensing system of claim 16, wherein the proximity sensor is a non-temperature sensor.

18. The dispensing system of claim 16, comprising a housing within which the electronic device is contained, the housing comprising:
a wall lying within a plane, wherein:
at least some of the thermoelectric generation device is disposed on a first side of the plane; and at least some of the thermoelectric generation device is disposed on a second side of the plane.

19. The dispensing system of claim 16, comprising a housing within which the electronic device is contained, wherein:
at least some of the thermoelectric generation device disposed within an interior of the housing; and
at least some of the thermoelectric generation device not disposed within the interior of the housing.

* * * * *